US010199470B2

United States Patent
Bielunis et al.

(10) Patent No.: US 10,199,470 B2
(45) Date of Patent: Feb. 5, 2019

(54) FIELD EFFECT TRANSISTOR HAVING STAGGERED FIELD EFFECT TRANSISTOR CELLS

(71) Applicant: Raytheon Company, Waltham, MA (US)

(72) Inventors: Alan J. Bielunis, Hampstead, MA (US); Istvan Rodriguez, Chelsea, MA (US); Christopher M. Laighton, Boxborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/346,224

(22) Filed: Nov. 8, 2016

(65) Prior Publication Data

US 2018/0130888 A1    May 10, 2018

(51) Int. Cl.
| | | |
|---|---|---|
| *H01L 29/417* | (2006.01) | |
| *H01L 27/02* | (2006.01) | |
| *H01L 27/088* | (2006.01) | |
| *H01L 29/06* | (2006.01) | |
| *H01L 29/78* | (2006.01) | |
| *H01L 29/423* | (2006.01) | |
| *H01L 29/812* | (2006.01) | |

(52) U.S. Cl.
CPC .... *H01L 29/41758* (2013.01); *H01L 27/0207* (2013.01); *H01L 27/088* (2013.01); *H01L 29/0692* (2013.01); *H01L 29/0696* (2013.01); *H01L 29/4236* (2013.01); *H01L 29/78* (2013.01); *H01L 29/7827* (2013.01); *H01L 29/812* (2013.01)

(58) Field of Classification Search
CPC ............... H01L 29/7827; H01L 29/41758
See application file for complete search history.

(56) References Cited

U.S. PATENT DOCUMENTS

| | | | |
|---|---|---|---|
| 9,685,438 B2 * | 6/2017 | Laighton | ............... H01L 27/088 |
| 2003/0013276 A1 * | 1/2003 | Asano | ................. H01L 23/4824 |
| | | | 438/459 |

(Continued)

FOREIGN PATENT DOCUMENTS

| | | |
|---|---|---|
| EP | 2053660 | 4/2009 |
| EP | 2056351 | 5/2009 |

(Continued)

OTHER PUBLICATIONS

PCT International Search Report and Written Opinion dated Feb. 21, 2018 for International Application No. PCT/US2017/060538; 17 pages.

*Primary Examiner* — Matthew Reames
*Assistant Examiner* — Wilner Jean Baptiste
(74) *Attorney, Agent, or Firm* — Daly, Crowley, Mofford & Durkee, LLP

(57) ABSTRACT

A Field Effect Transistor (FET) having a substrate; a plurality of active regions disposed on the substrate; and a laterally extending finger-like control electrode disposed on a portion of a surface of the substrate. The active regions are laterally spaced one from the other successively along the laterally extending finger-like control electrode. The laterally extending finger-like control electrode controls a flow of carriers through each one of the plurality of active regions between a source electrode and a drain electrode.

20 Claims, 12 Drawing Sheets

(56) References Cited

U.S. PATENT DOCUMENTS

| | | | | |
|---|---|---|---|---|
| 2004/0206983 A1* | 10/2004 | Yi | .................. | H01L 23/4824 |
| | | | | 257/202 |
| 2004/0245569 A1* | 12/2004 | Kowalski | ............... | G11C 29/02 |
| | | | | 257/328 |
| 2004/0256669 A1* | 12/2004 | Hower | ................ | H01L 29/7801 |
| | | | | 257/335 |
| 2017/0104063 A1 | 4/2017 | Zhang et al. | | |

FOREIGN PATENT DOCUMENTS

| | | |
|---|---|---|
| EP | 2339635 | 6/2011 |
| JP | 2012028707 | 2/2012 |
| WO | WO 2016070463 | 5/2016 |

* cited by examiner

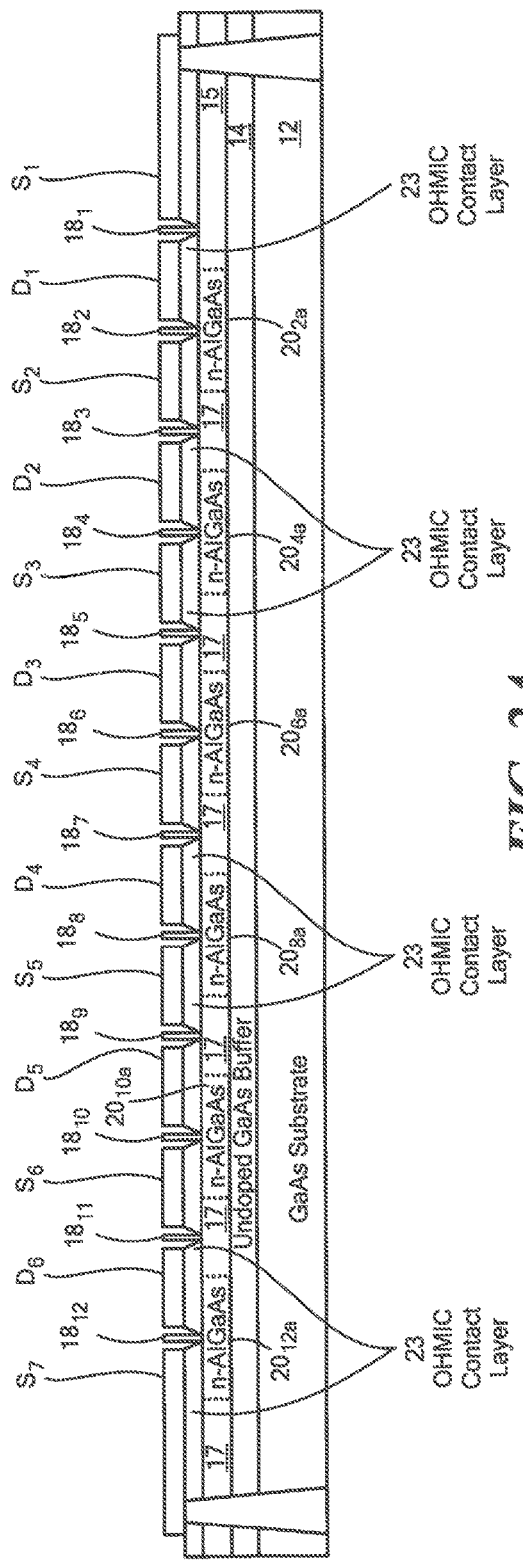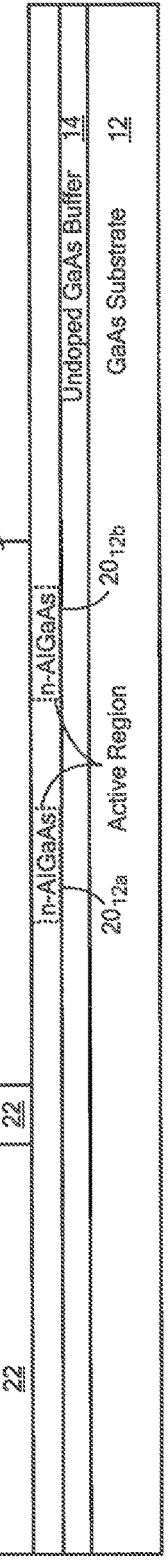
FIG. 2A
FIG. 2B

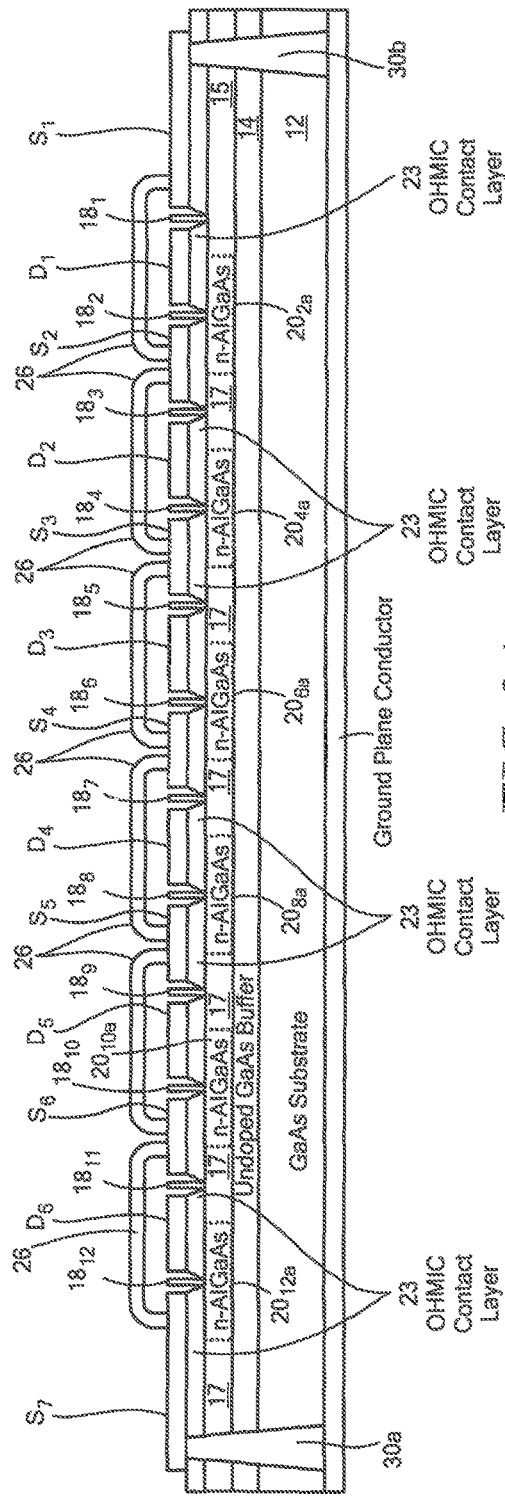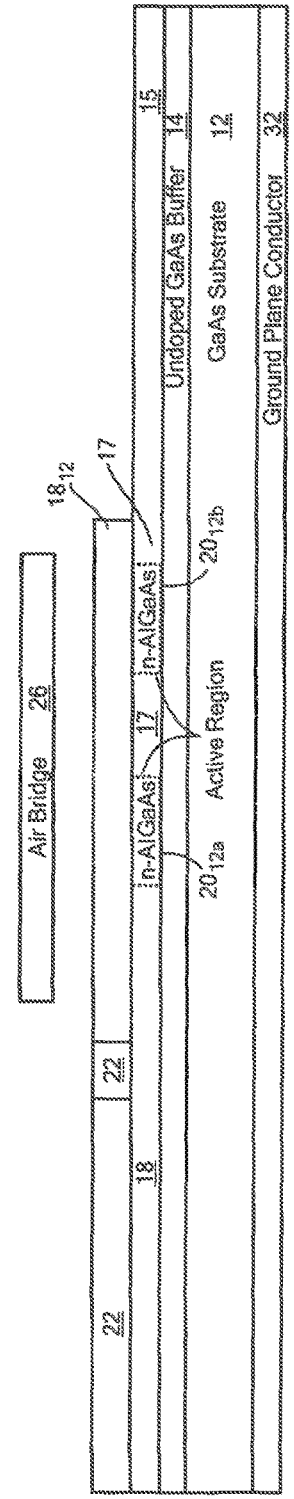

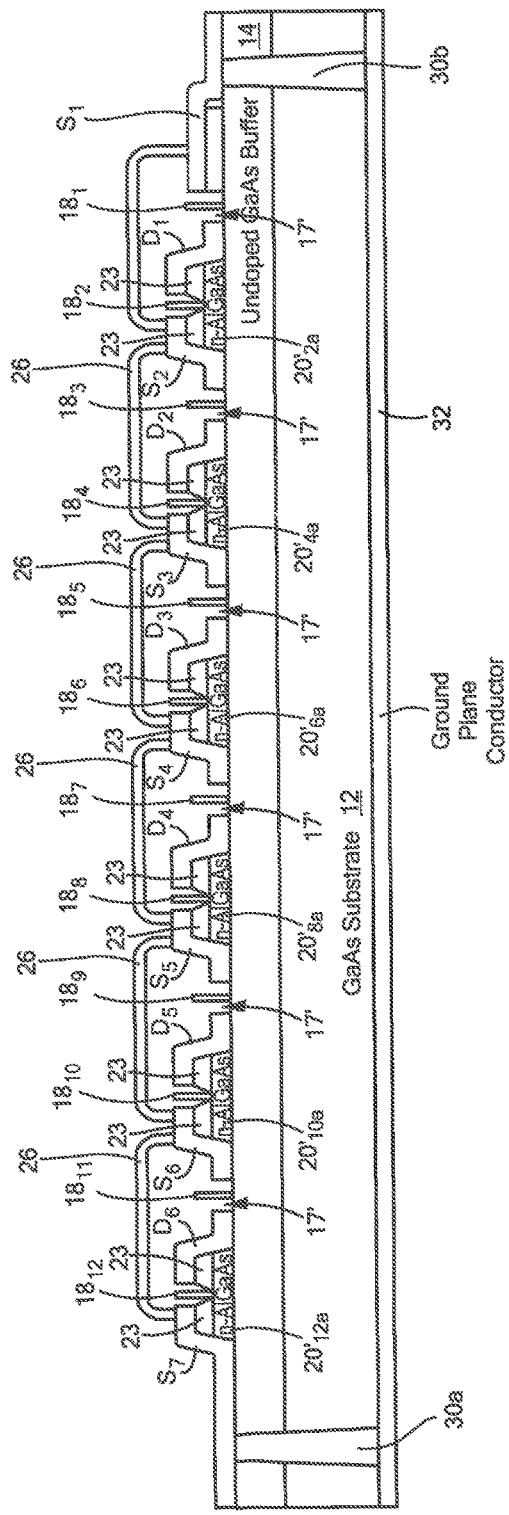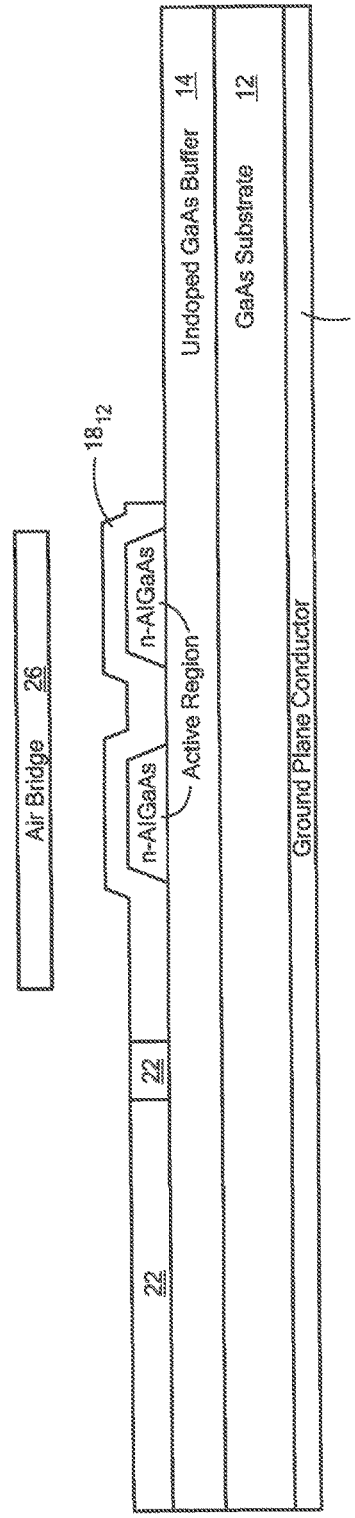
FIG. 5A
FIG. 5B

Stagger-FET

FIELD EFFECT TRANSISTOR HAVING STAGGERED FIELD EFFECT TRANSISTOR CELLS

TECHNICAL FIELD

This disclosure relates generally to Field Effect Transistors (FETs) and more particularly to improved layouts for sixth FETS.

BACKGROUND

As is known in the art, Field Effect Transistors (FETs) having a linear array of a plurality of FET cells are used in many applications. Each one of the FET cells has a source, a drain and a gate between the source and the drain to control a flow of carriers along a channel between the source and drain. In some FETS, as for example, shown in FIG. 1, the gates are finger-like gates (GF) interconnected to a common gate contact (GC) on the top surface of a substrate. Likewise, the drains are individual drain fingers (DF) connected to a common drain contact (DC) electrode on the top of the substrate, and the sources are source pads (S) on the top of the substrate and are connected to a common source contact, not shown, on the bottom of the substrate using interconnected air bridges, each air-bridge being over the a pair of gate fingers (GF) and one drain finger (DF) between a pair of gate fingers (GF), the ends of the interconnected air bridges being connected the common source contact, not shown, on the bottom surface of the substrate using vias that pass through the substrate to the common source contact, not shown, on the bottom surface of the substrate. Generally, many of these are FET cells are stacked together in a linear array, here along the Y-axis in FIG. 1, in the output stage of a power amplifier Monolithic Microwave Integrated Circuit (MMIC). The linear stacking of these FET cells determines the linear dimension size of the MMIC.

SUMMARY

In accordance with the present disclosure, a transistor is provided having: a substrate; a plurality of active regions disposed on the substrate; and a laterally extending finger-like control electrode disposed on a portion of a surface of the substrate, the active regions being laterally spaced one from the other successively along the laterally extending finger-like gate electrode. The laterally extending finger-like electrode controls a flow of carriers through each one of the plurality of active regions between a first electrode and a second electrode.

In one embodiment, a Field Effect Transistor (FET) is provided having: a substrate; a plurality of active regions disposed on the substrate; and a laterally extending finger-like gate electrode disposed on a portion of a surface of the substrate; such laterally extending finger-like gate electrode making Schottky contact with the plurality of active regions, the active regions being laterally spaced one from the other successively along the laterally extending finger-like gate electrode. The laterally extending finger-like gate electrode controls a flow of carriers through each one of the plurality of active regions between a source electrode and a drain electrode.

In one embodiment, the active regions are separated one from another by inactive regions of resistivity higher than the resistivity of the active regions.

In one embodiment, a Field Effect Transistor (FET) is provided having: a substrate; and a plurality of FET cells disposed on the substrate. Each one of the cells includes: a plurality of active regions disposed on the substrate; and a laterally extending finger-like gate electrode disposed on a portion of a surface of the substrate; such laterally extending finger-like gate electrode making Schottky contact with the plurality of active regions, the plurality of active regions being staggered on successively alternating opposite sides of the laterally extending finger-like gate electrode. The laterally extending finger-like gate electrode controls a flow of carriers through each one of the plurality of active regions between a source electrode and a drain electrode. A gate contact is electrically connected to the laterally extending finger-like gate electrode of each one of the FET cells; a drain contact electrically is connected to the drain electrode of each one of the FET cells; and a source contact is electrically connected to the drain electrode of each one of the FET cells.

In one embodiment, the plurality of FET cells are disposed in columns along the surface of the substrate perpendicular to the laterally extending finger-like gate electrode of each one of the plurality of FET cells.

In one embodiment, the plurality of active regions is contiguous along the surface of the substrate.

In one embodiment, the plurality of active regions is arranged in a checkerboard arrangement.

In one embodiment, a Field Effect Transistor (FET) includes: a substrate; a plurality of active regions separated by a plurality of inactive regions disposed on the substrate; and a laterally extending finger-like control electrode disposed on a portion of a surface of the substrate; the plurality of active regions being staggered on successively alternating opposite sides of the laterally extending finger-like gate electrode. The laterally extending finger-like gate electrode controls a flow of carriers through each one of the plurality of active regions between a source electrode and a drain electrode.

In one embodiment, the inactive regions have a higher resistivity that the active regions.

With such an arrangement, thermal spreading is improved thereby allowing for closer gate to gate spacing which in turn reduces the size of the FET cell. Further, the addition of the inactive regions requires an increase in the length of the gate electrode and thereby allowing space for additional source VIA connections. Still further, the series gate resistance resulting from the increase in gate electrode length improves FET stability without requiring external series gate resistors.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 2, 2A and 2B, are a plan view and a pair of side view of a FET according to the disclosure at one stage in the fabrication thereof; the cross section of FIG. 2A being taken along line 2A-2A of FIG. 2 and the cross section of FIG. 2B being taken along line 2B-2B of FIG. 2;

FIGS. 3, 3A and 3B, are a plan view and a pair of side view of a FET according to the disclosure after completion of the FET of FIGS. 2, 2A and 2B; the cross section of FIG. 3A being taken along line 3A-3A of FIG. 3 and the cross section of FIG. 3B being taken long line 3B-3B of FIG. 3;

FIGS. 4A and 4B being cross sections of FIG. 4 being taken along line 4A-4A of FIG. 4 and the cross section of FIG. 4B being taken long line 4B-4B of FIG. 4;

FIGS. 5A and 5B being cross sections of FIG. 5 being taken along line 5A-5A of FIG. 5 and the cross section of FIG. 5B being taken long line 5B-5B of FIG. 4;

Like reference symbols in the various drawings indicate like elements.

DETAILED DESCRIPTION

Figure 2:
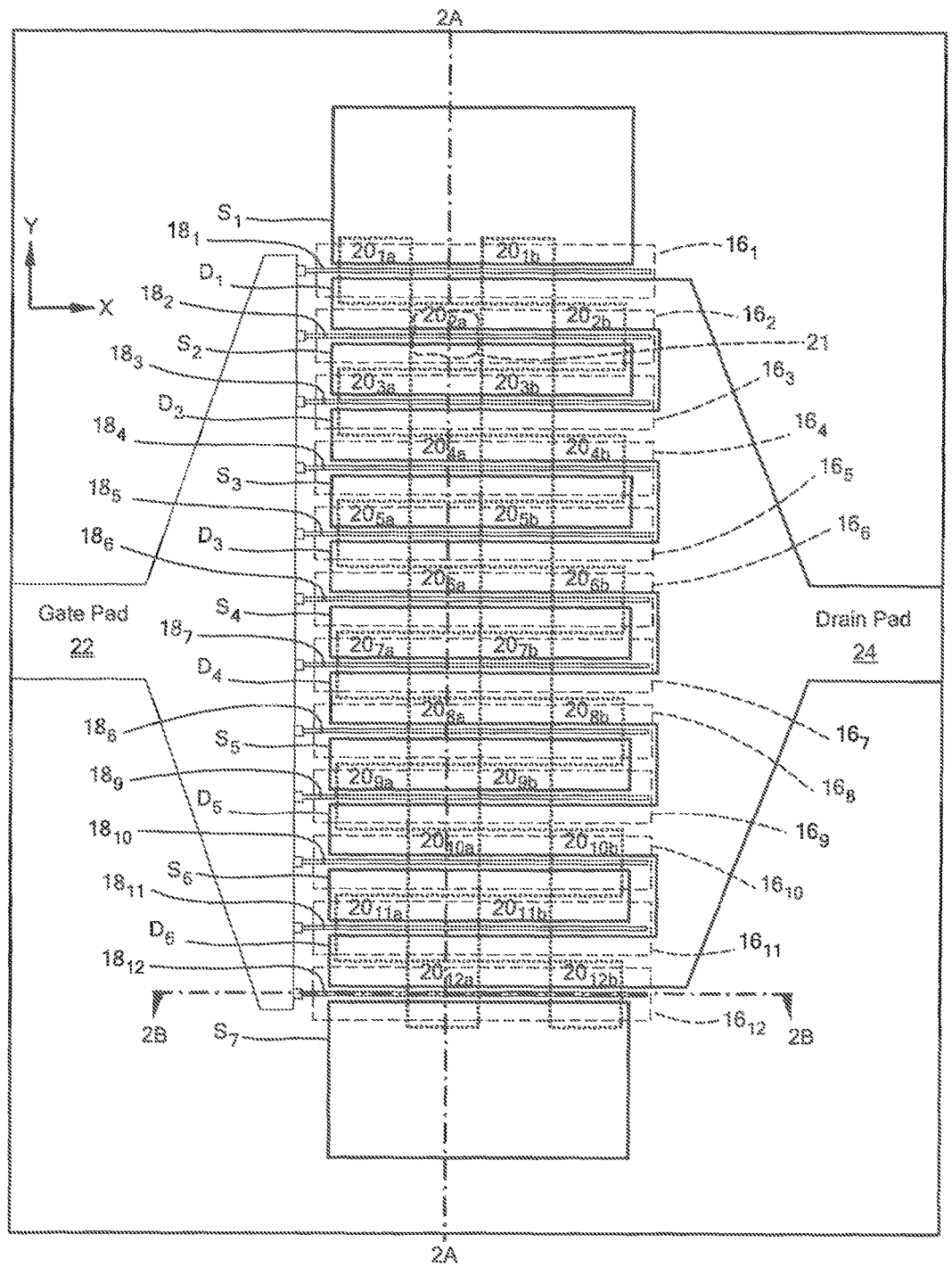
Figure 2C:
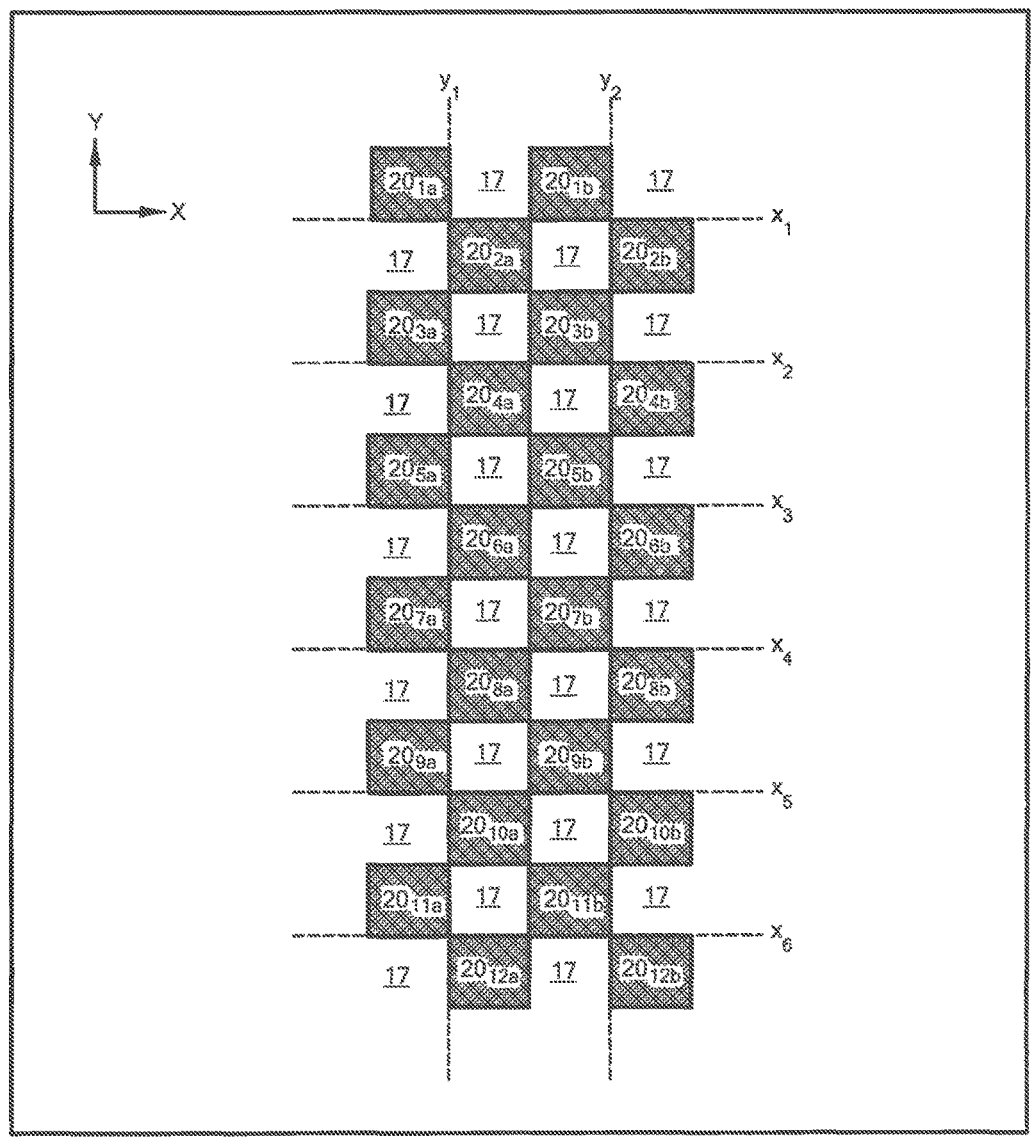
FIG. 2C is a plan view showing a layout of active regions used in the FET of FIGS. 2, 2A and 2B according to the disclosure.
Figure 2D:
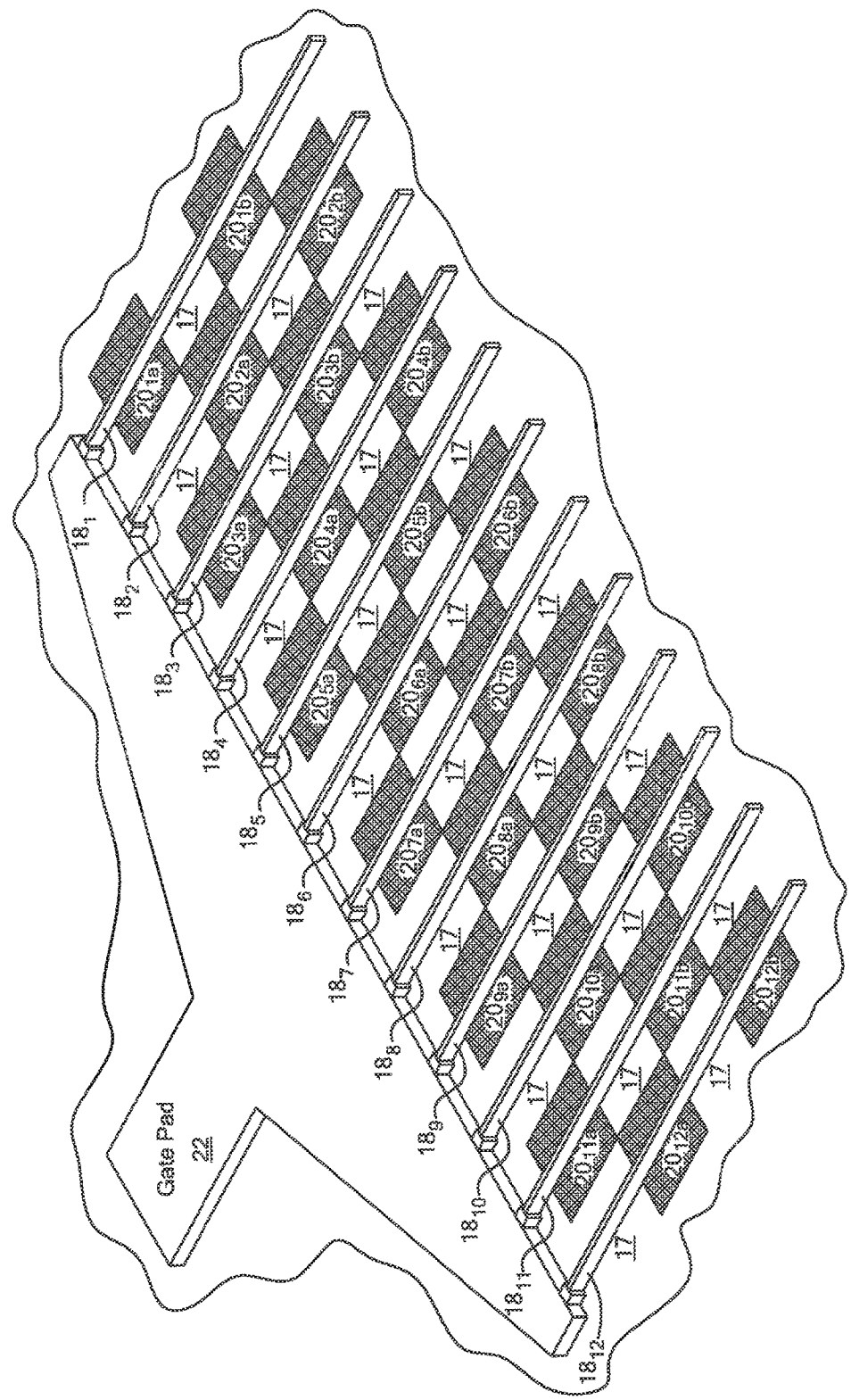
FIG. 2D is an isometric sketch showing the relationship between the active regions of the FET of FIG. 2 and gate electrodes of such FET according to the disclosure.

Referring now to FIGS. 2, 2A and 2B, a substrate 12, here, in this example, a Gallium Arsenide (GaAs) substrate 12 having an undoped GaAs buffer layer 14, is shown. A plurality of, here twelve FET cells $16_1$-$16_{12}$ each one of the cells $16_1$-$16_{12}$ having a corresponding one of twelve laterally extending finger-like control electrodes $18_1$-$18_{12}$ is disposed on a portion of a surface of the substrate 12. Thus, here the FET cells $16_1$-$16_{12}$ are arranged in twelve rows, as shown. Each one of the twelve laterally extending finger-like control electrodes $18_1$-$18_{12}$ is in Schottky contact with a plurality of, here, in this example, two, spaced, active regions $20_{1a}$, $20_{1b}$-$20_{12}$a, $20_{12}$b, respectively; here each one of the active device regions $20_{1a}$, $20_{1b}$-$20_{12}$a, $20_{12}$b, is, in this example, an n⁻doped AlGaAs region. The n⁻doped AlGaAs regions $20_{1a}$, $20_{1b}$-$20_{12}$a, $20_{12}$b, are formed in an n⁻doped AlGaAs layer 15 by ion implantating high resistance ions, here for example oxygen ions, in regions 17 of the n⁻doped AlGaAs layer 15 between the n⁻doped AlGaAs region $20_{1a}$, $20_{1b}$-$20_{12}$a, $20_{12}$b, of the n⁻doped AlGaAs layer 15, as shown. That is, the ion implanted regions 17 define the boundaries of the n⁻doped AlGaAs active device regions $20_{1a}$, $20_{1b}$-$20_{12}$a, $20_{12b}$ within the n⁻doped AlGaAs layer 15. The layout of the active regions $20_{1a}$, $20_{1b}$-$20_{12}$a, $20_{12}$b, is shown in FIG. 2C. It is noted that here the active regions $20_{1a}$, $20_{1b}$-$20_{12}$a, $20_{12}$b are arranged in a checkerboard arrangement. Thus, the active regions $20_{1a}$, $20_{1b}$-$20_{12}$a, $20_{12b}$, are successively spaced along finger-like control electrodes $18_1$-$18_{12}$, as shown in FIG. 2D. More particularly, the active regions $20_{1a}$, $20_{1b}$-$20_{12a}$, $20_{12b}$, are separated one from another by portions of the more highly resistive undoped. GaAs buffer layer 14. Thus, the portions of the undoped GaAs buffer layer 14 between the active regions $20_{1a}$, $20_{1b}$-$20_{12a}$, $20_{12b}$ are inactive regions having a resistivity higher that the resistivity of the active regions $20_{1a}$, $20_{1b}$-$20_{12a}$, $20_{12b}$.

Each one of the twelve finger-like gate electrodes $18_1$-$18_{12}$ controls a flow of carriers through channels (an exemplary one of the channels being indicated by the dotted loop 21) provided by the two active regions $20_{1a}$, $20_{1b}$-$20_{12a}$, $20_{12b}$, respectively, between one of a plurality of, here seven source electrodes $S_1$-$S_7$ and one of a plurality of, here six, finger-like drain electrodes $D_1$-$D_6$; the source electrodes $S_1$-$S_7$ and the drain electrodes $S_1$-$S_6$ being in ohmic contact with a n⁺ GaAs cap layer 23 over a corresponding a pair of the active regions $20_{1a}$, $20_{1b}$-$20_{12a}$, $20_{12b}$, respectively, as indicated. Thus, each one of the twelve FET cells $16_1$-$16_{12}$ includes:

| FET CELL | GATE ELECTRODE | ACTIVE REGIONS | SOURCE ELECTRODE | DRAIN ELECTRODE |
|---|---|---|---|---|
| $16_1$ | $18_1$ | $20_{1a}$, $20_{1b}$ | $S_1$ | $D_1$ |
| $16_2$ | $18_2$ | $20_{2a}$, $20_{2b}$ | $S_2$ | $D_1$ |
| $16_3$ | $18_3$ | $20_{3a}$, $20_{3b}$ | $S_2$ | $D_2$ |
| $16_4$ | $18_4$ | $20_{4a}$, $20_{4b}$ | $S_3$ | $D_2$ |
| $16_5$ | $18_5$ | $20_{5a}$, $20_{5b}$ | $S_3$ | $D_3$ |
| $16_6$ | $18_6$ | $20_{6a}$, $20_{6b}$ | $S_4$ | $D_3$ |
| $16_7$ | $18_7$ | $20_{7a}$, $20_{7b}$ | $S_4$ | $D_4$ |
| $16_8$ | $18_8$ | $20_{8a}$, $20_{8b}$ | $S_5$ | $D_4$ |
| $16_9$ | $18_9$ | $20_{9a}$, $20_{9b}$ | $S_5$ | $D_5$ |
| $16_{10}$ | $18_{10}$ | $20_{10a}$, $20_{10b}$ | $S_6$ | $D_5$ |
| $16_{11}$ | $18_{11}$ | $20_{11a}$, $20_{11b}$ | $S_6$ | $D_6$ |
| $16_{12}$ | $18_{12}$ | $20_{12a}$, $20_{12b}$ | $S_7$ | $D_6$ |

It is noted that while portions of the finger-like control electrodes $18_1$-$18_{12}$ make Schottky contact with the active regions $20_{1a}$, $20_{1b}$-$20_{12}$a, $20_{12b}$other portions of the finger-like control electrodes $18_1$-$18_{12}$ are disposed on the higher resistivity undoped GaAs buffer layer 14, as shown.

It is noted that the active regions $20_{1a}$, $20_{1b}$-$20_{12}$a, $20_{12b}$, are disposed in a checkerboard arrangement in an X-Y plane, as indicated by the X-Y axes in FIGS. 2 and 2C. It is next noted that the active regions in each one of the pairs of active regions $20_{1a}$, $20_{1b}$-$20_{12}$a, $20_{12b}$ $20_{1a}$, $20_{1b}$ are laterally spaced along the X direction and that the active regions $20_{1a}$-$20_{12a}$ are staggered, or offset with respect to the active regions $20_{1b}$-$20_{12b}$ along the Y direction. More particularly, the active regions $20_{1a}$, $20_{1b}$ along finger-like control electrodes $18_1$ are staggered, or offset, along the X direction with respect to the active regions $20_{2a}$, $20_{2b}$ of the successive finger-like control electrodes $18_2$. Likewise, the active regions $20_{2a}$, $20_{2b}$ along finger-like control electrodes $18_2$ are staggered, or laterally offset, with respect to the active regions $20_{3a}$, $20_{3b}$ of the successive finger-like control electrodes $18_3$ and so forth down successive rows of the twelve finger-like gate electrodes $18_1$-$18_{12}$. Thus, considering for example, a line $Y_1$ along the Y direction, passing vertically through the right edges of the active regions $20_{1a}$, $20_{3a}$, $20_{5a}$, $20_{7a}$, $20_{9a}$, and $20_{11a}$, and the left edges of active regions $20_{3a}$, $20_{4a}$, $20_{6a}$, $20_{8a}$, $20_{10a}$, and $20_{12a}$, it is noted that these active regions $20_{1a}$-$20_{12a}$ are staggered, or alternate about, the line $Y_1$ (FIG. 2C). Likewise, active regions $20_{1b}$-$20_{12a}$ are staggered, or alternate about, the line $Y_1$. In like manner, active regions $20_{1a}$, $20_{2a}$, $20_{1b}$ and $20_{2b}$ are staggered about line $X_1$; active regions $20_{3a}$, $20_{4a}$, $20_{3b}$ and $20_{4b}$ are staggered about line $X_2$; active regions $20_{5a}$, $20_{6a}$, $20_{5b}$ and $20_{6b}$ are staggered about line $X_3$; active regions $20_{7a}$, $20_{8a}$, $20_{7b}$ and $20_{8b}$ are staggered about line $X_4$: active regions $20_{9a}$, $20_{10a}$, $20_{9b}$ and $20_{10b}$ are staggered about line $X_5$: and active regions $20_{11a}$, $20_{12a}$, $20_{11b}$ and $20_{12b}$ are staggered about line $X_6$, as shown.

Referring also to FIG. 2D, a gate contact pad 22 is disposed on the surface of the undoped GaAs buffer layer 12 and is connected to one end of the twelve laterally extending finger-like control electrodes $18_1$-$18_{12}$, as shown. A drain contact pad 24 is disposed on the surface of the undoped GaAs buffer layer 14 and is connected to one end of the six laterally extending drain electrodes $D_1$-$D_6$, as shown.

Figure 3:
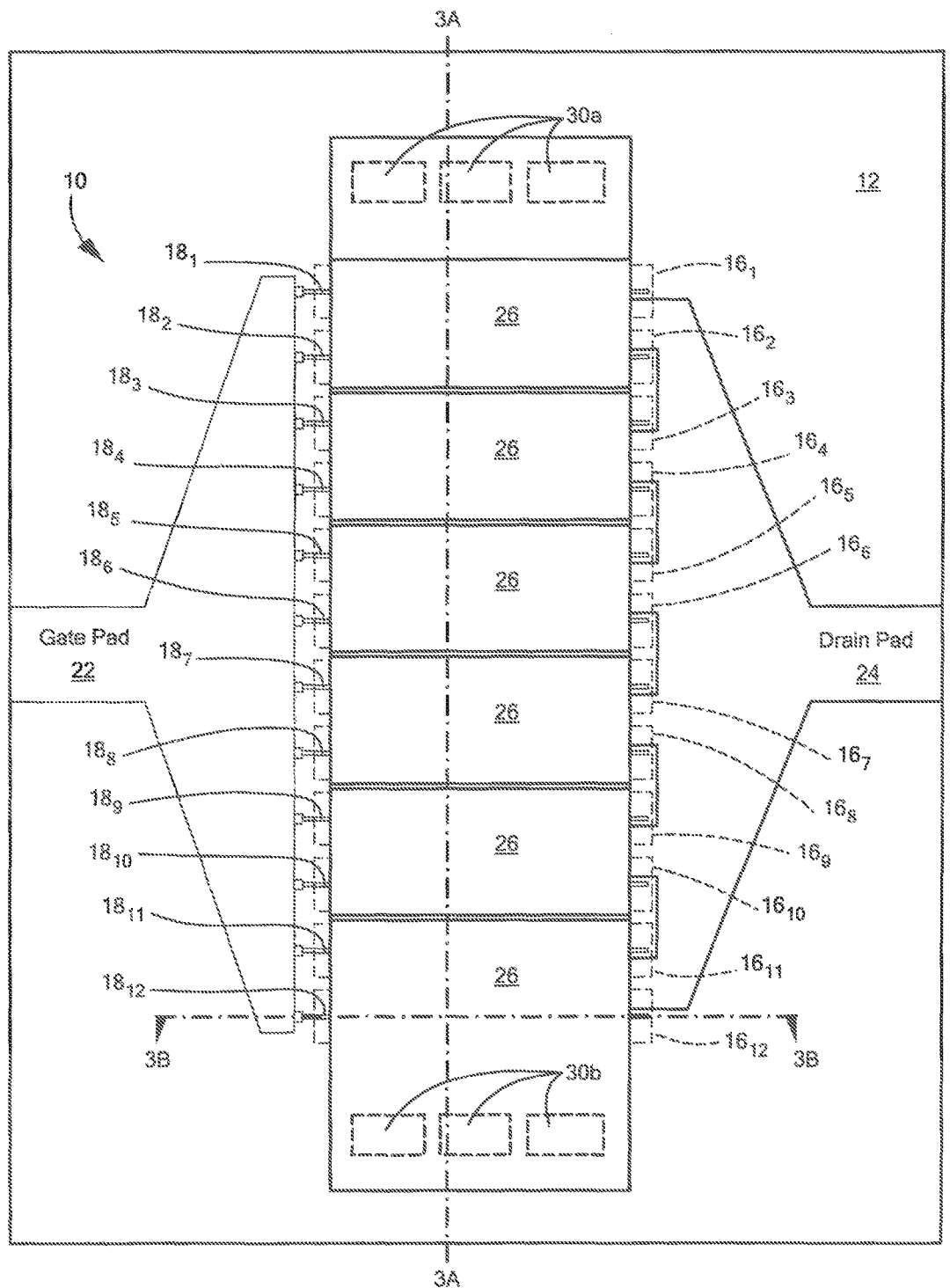

After forming the structure shown in FIGS. 2, 2A and 2B, the seven source electrodes $S_1$-$S_7$ are electrically connected with air-bridges 26, as shown in FIGS. 3, 3A and 3B; the ends of the air-bridges 26 being connected to source pads $28_1$, $28_{13}$; the source pads $28_1$ and $28_{13}$ being connected to a ground plane conductor 32 on the bottom of the substrate 12 with vertical conductive vias 30a, 30b, respectfully, passing through the substrate 12 and the undoped GaAs buffer layer 14, as shown to provide a FET 10.

Figure 4:
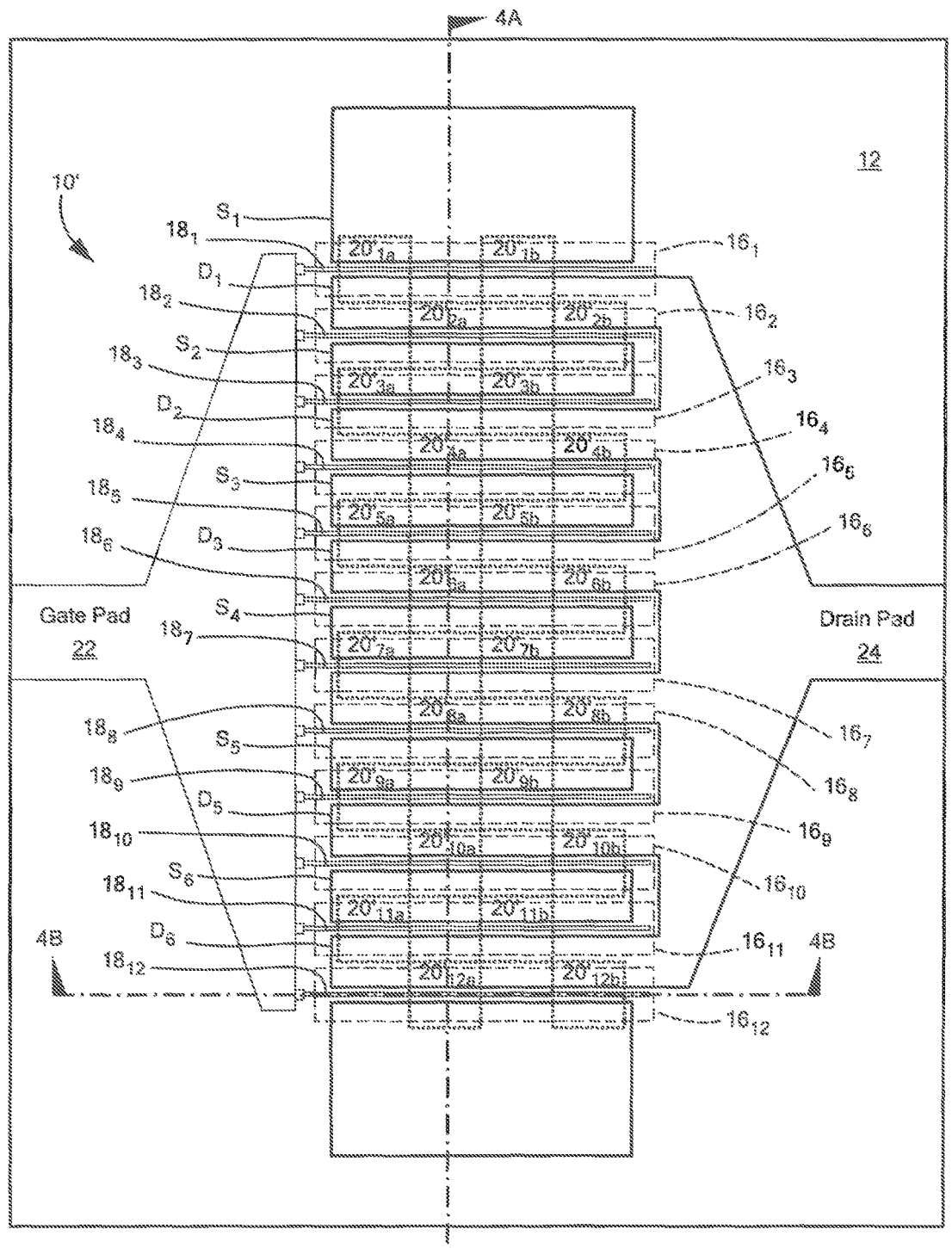
FIGS. 4, 4A and 4B are a plan view and a pair of side view of a FET according to another embodiment of the disclosure at one stage in the fabrication thereof of the FET.
Figure 4A:
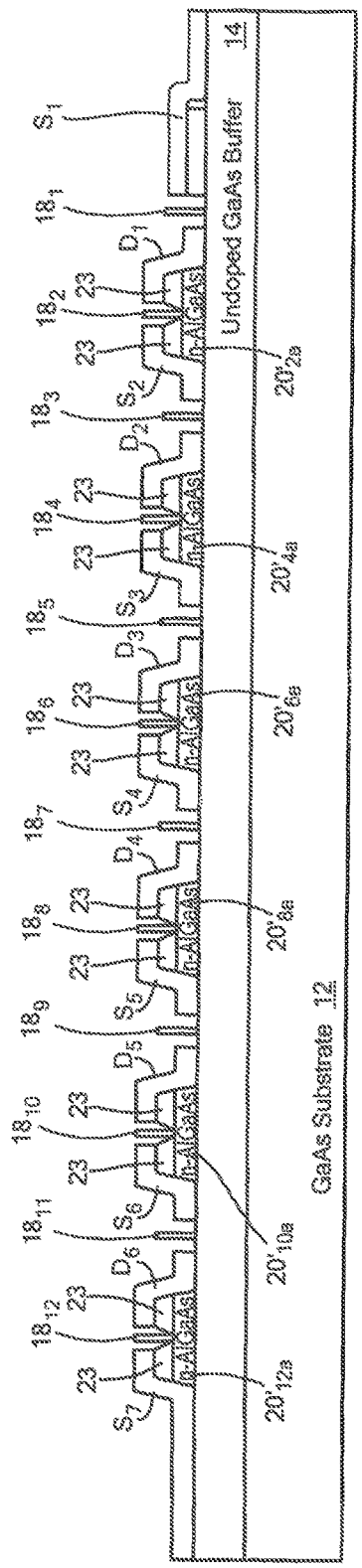
Figure 4B:
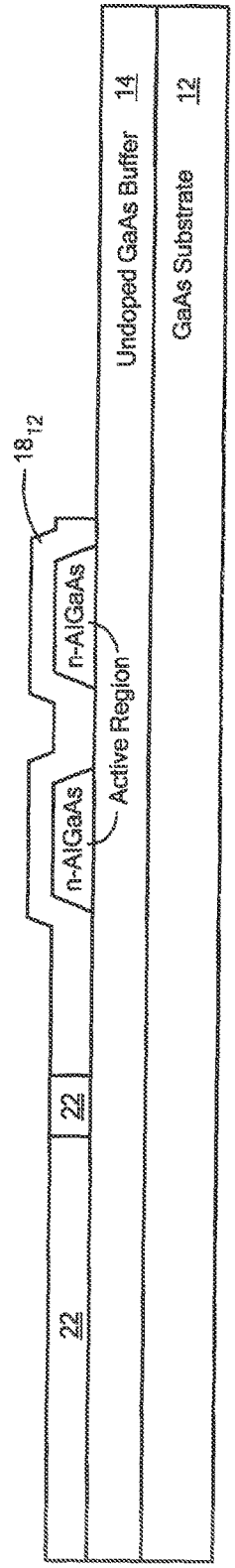
Figure 5:
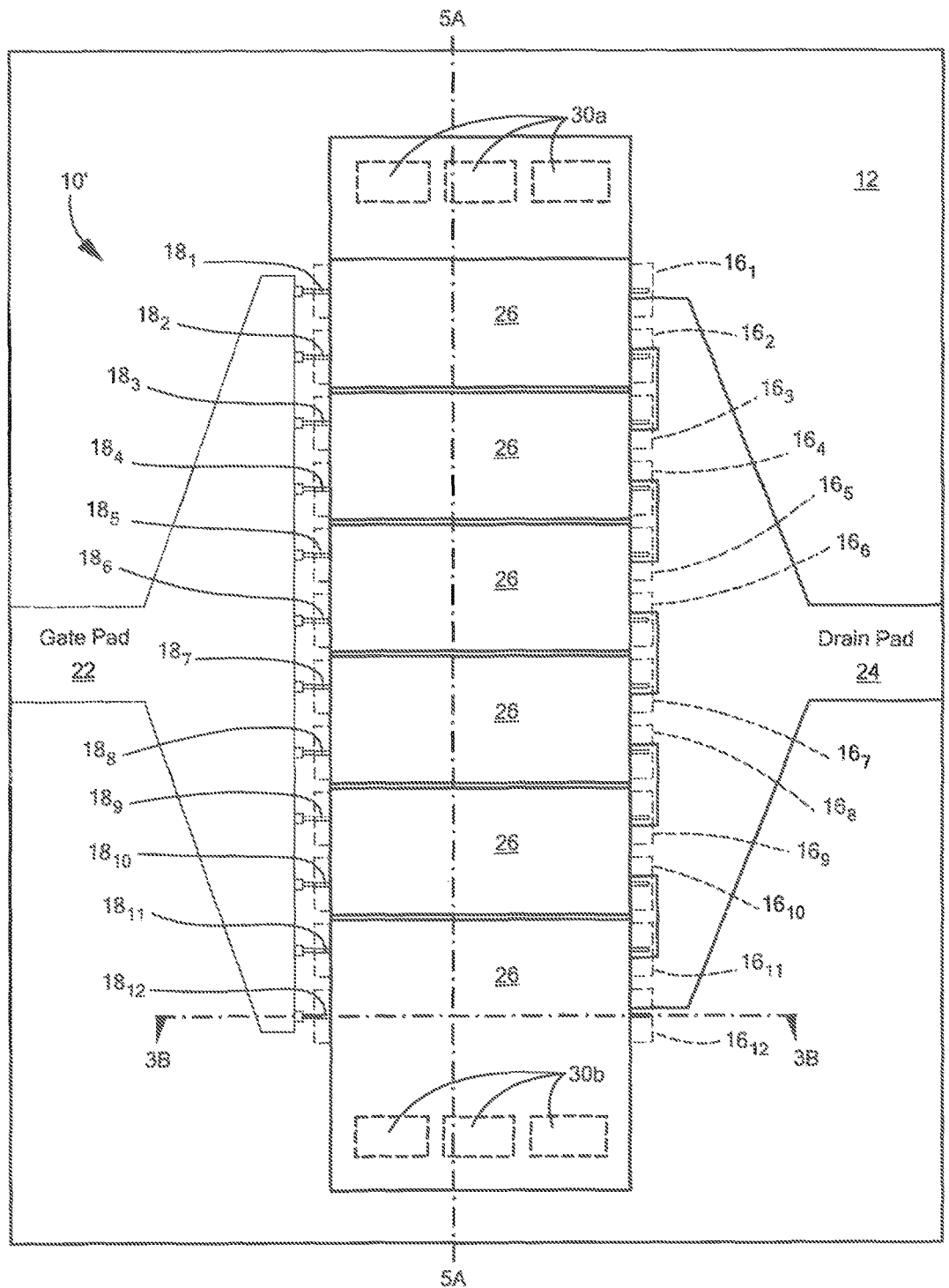
FIGS. 5A and 5B are a plan view and a pair of side view of a FET according to another embodiment of the disclosure after completion of the FET ref FIGS. 4, 4A and 4B.

Referring now to FIGS. 4, 4A and 4B, here in this example, instead for forming the active regions $20_{1a}$, $20_{1b}$-$20_{12}$a, $20_{12b}$, isolate by ion implanted regions 17 in the n⁻doped AlGaAs layer 15 as in FIGS. 2, 2A and 2B, here the active regions $20_{1a}$, $20_{1b}$-$20_{12}$a, $20_{12b}$, are formed as mesa structures $20'_{1a}$, $20'_{1b}$-$20'_{12}$a, $20'_{12b}$, isolated by regions 17' of air; here again, the resistivity of the active regions $20'_{1a}$, $20'_{1b}$-$20'_{12}$a, $20'_{12b}$, is less than the resistivity of the spaces, or regions 17', here air, between the active regions $20_{1a}$, $20_{1b}$-$20_{12}$a, $20_{12b}$; and, after forming the structure shown in FIGS. 4, 4A and 4B, the source electrodes are interconnected by air bridges 26 and through vias 30a, 30b to the ground plane conductor 32 as shown in FIGS. 5, 5A and 5B to form FET 10'.

Figure 1:
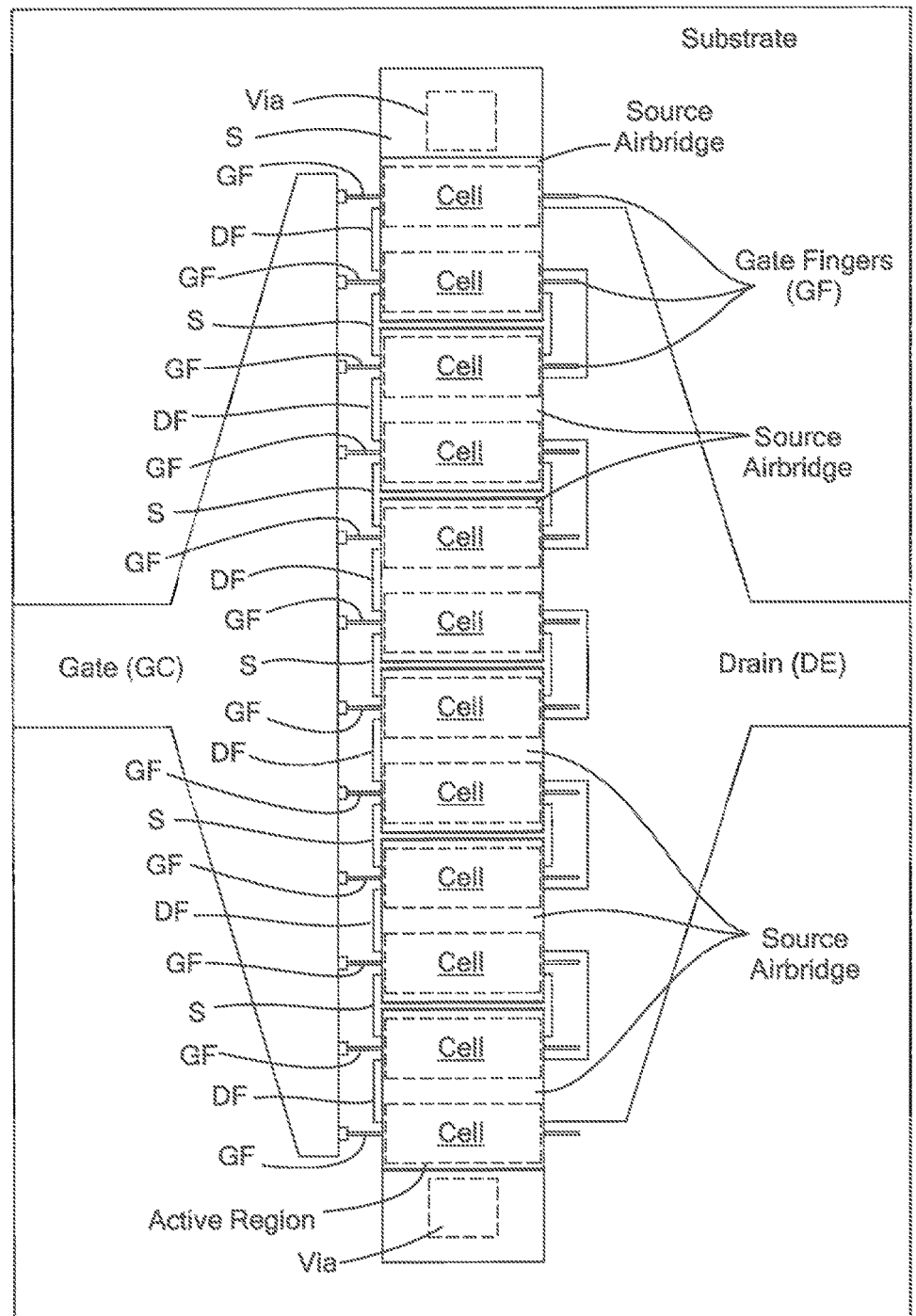
FIG. 1 is plan view of a Field Effect Transistor (FET) according to the PRIOR ART.
Figure 6A:
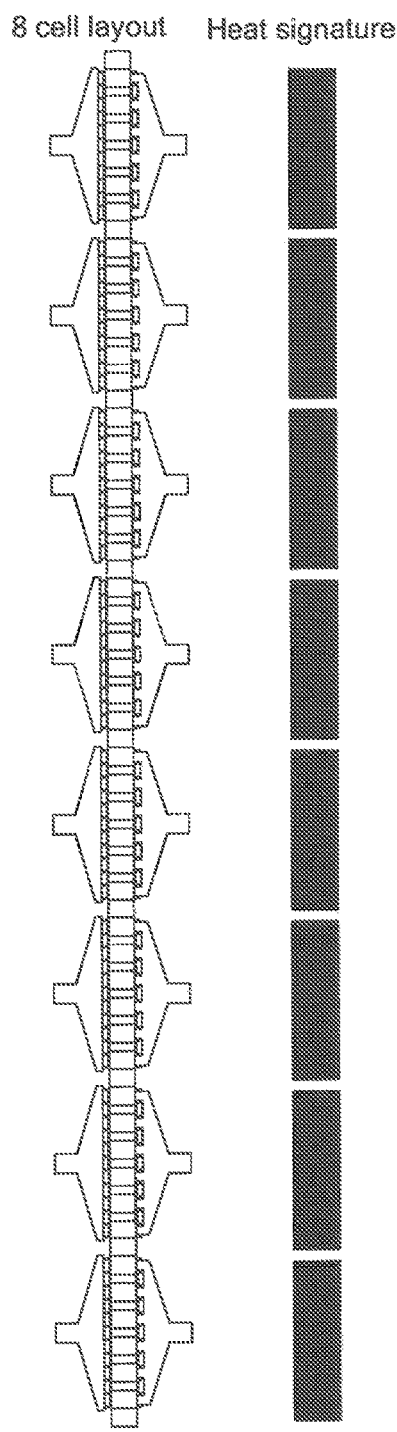
FIGS. 6A and 6B are plan view diagrammatic sketches showing heat distributions of heat generated in active regions of the FETs of FIG. 1 and FIG. 2, respectively.
Figure 6B:
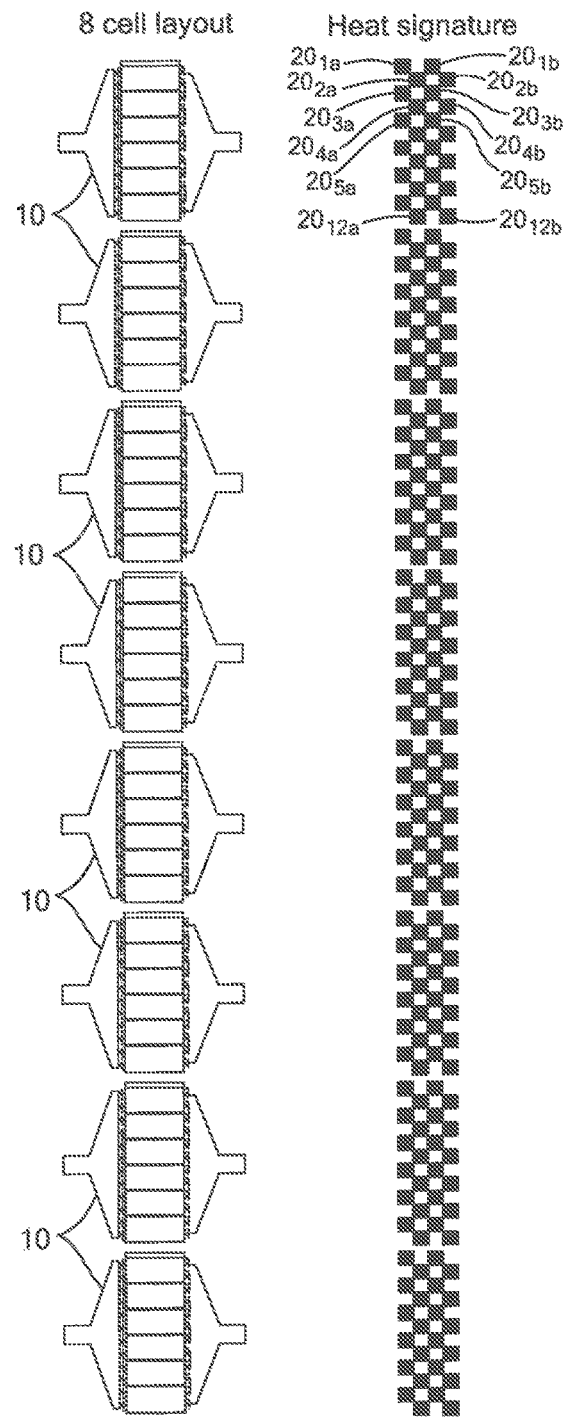

Referring now to FIGS. 6A and 6B, a comparison is made between the distribution of heat generated by the active regions $20_{1a}$, $20_{1b}$-$20_{12}$a, $20_{12b}$ of FET 10 and the heat generated by the active regions of the structure shown in FIG. 1. It is noted that with the "Staggered" or checkerboard arrangement of the active region the active regions $20_{1a}$, $20_{1b}$-$20_{12a}$, $20_{12b}$ of the MMIC FET cell arrangement (the FETs 10 and 10' described above in connection with FIGS. 3, 3A and 3B and 5, 5A and 5B) a combination of electrically higher conductivity active regions and higher resistivity regions between the higher conductivity active regions generates staggered, higher resistivity regions that dissipate heat generated higher conductivity active regions in order to achieve a more compact FET. It is noted that each individual heat signature is spread in both the X and Y axis. Gate to gate spacing can be reduced which allows for a smaller FET as well as reduced capacitive parasitics. The increased resistive nature of the gates, helps with overall device stability. The active regions can be defined through mesa etch isolation or ion implant isolation which renders inactive areas to be high resistive. The increased length of the gate electrode allows for additional source VIAs which reduces the source inductance; as an example, with the checkerboard shown in FIG. 2D, the length of the gate electrode would be doubled when compared to the prior art.

A number of embodiments of the disclosure have been described. Nevertheless, it will be understood that various modifications may be made without departing from the spirit and scope of the disclosure. For example, the materials used for then active regions, the buffer layer, or the ohmic contact layer may be other than the materials described above. Further, the number of cells used for the FET may be larger or smaller than the twelve cell structure described above. Still further, the transistor may be other than a field effect transistor such as a bipolar transistor wherein the base electrode may serve as the carrier control electrode. Accordingly, other embodiments are within the scope of the following claims.

What is claimed is:
1. A Field Effect Transistor (FET), comprising:
a substrate;
a plurality of active regions arranged in rows and columns disposed on the substrate, the active regions in each one of the rows being separated one from another by an inactive region and the active regions in each one of the columns being separated one from another by the inactive region; and
a plurality of gate electrodes arranged in rows, each one of the rows of gate electrodes being disposed over the active regions and the inactive region in a corresponding one of the rows of active regions.

2. The Field Effect Transistor (FET) recited in claim 1 wherein each one of the inactive regions has a resistivity higher than a resistivity of each one of the active regions.

3. The FET recited in claim 2 gate electrodes are elongated.

4. The Field Effect Transistor (FET) recited in claim 2 wherein the active regions and the inactive region are arranged in a checkerboard arrangement.

5. The Field Effect Transistor (FET) recited in claim 1 wherein the plurality of active regions is contiguous along the surface of the substrate.

6. The Field Effect Transistor recited in claim 1 wherein the active regions and the inactive regions are arranged in a checkerboard arrangement.

7. A Field Effect Transistor (FET), comprising:
a substrate;
a plurality of rows and columns of active regions disposed on the substrate, the active regions in each one of the rows and columns being separated by an inactive region;
a plurality of rows of finger-like control electrodes, each one of the control electrodes being disposed over the active regions and the inactive region in a corresponding one of the rows; the plurality of active regions being staggered on alternating opposite sides of a lines between a pair of the columns of active regions; and
wherein the laterally extending finger-like control electrodes controls a flow of carriers through each one of the plurality of active regions between a source electrode and a drain electrode.

8. The Field Effect Transistor (FET) recited in claim 7 wherein each one of the inactive regions a higher resistivity than each one of the active regions.

9. The Field Effect Transistor (FET) recited in claim 7 wherein the active regions and the inactive regions are arranged in a checkerboard arrangement.

10. The Field Effect Transistor (FET) recited in claim 7 wherein each one of the inactive regions has a higher resistivity than each one of the active regions.

11. A Field Effect Transistor (FET), comprising:
a substrate;
a plurality of gate electrodes;
a plurality of sets of regions, each one of the sets comprising:
a plurality of active regions and a plurality of inactive regions, each one of the active regions in each one of the sets being separated by a corresponding one of a plurality of inactive regions in such one of the sets;
wherein each one of the plurality of gate electrodes is disposed over the plurality of active regions and inactive regions in a corresponding one of the sets;
wherein adjacent pairs of such sets are separated along a common line; and
wherein the active regions each one of such pairs of sets are staggered successively on opposite sides of the common line.

12. The Field Effect Transistor (FET) recited in claim 11 wherein each one of the inactive regions has a higher resistivity than each one of the active regions.

13. The Field Effect Transistor (FET) recited in claim 11 wherein the plurality of gate electrodes are connected to a common gate contact.

14. A Field Effect Transistor (FET), comprising:
a substrate;
an array of plurality of rows of linear arrays of regions, one of the regions being an active region and another one of the regions being an inactive region, the active regions being separated one from another by the inactive regions, the array of plurality of rows of linear arrays of regions being disposed on the substrate;
a plurality of control electrodes, each of plurality of control electrodes being disposed over the active region and the inactive region in a corresponding one of the plurality of rows of linear arrays of regions;
wherein:
each one of the plurality of active regions in a first one of the plurality of rows of linear arrays of regions being disposed between:
a first pair of inactive regions in said first one of the plurality of rows of linear arrays of regions;
a second pair of inactive regions;
wherein one of the inactive regions in the second pair of inactive regions being in a second one of the plurality of rows of linear arrays of regions and one of the inactive regions in the second pair of inactive regions being in a third one of the plurality of rows of linear arrays of regions; and
wherein the first one of the plurality of rows of linear arrays of regions is disposed between: the second one of the plurality of rows of linear arrays of regions; and the third one of the plurality of rows of linear arrays of regions.

15. A Field Effect Transistor (FET), comprising:
a substrate;
an array of plurality of rows of linear arrays of regions, one of the regions being an active region and another one of the regions being an inactive region, the active regions being separated one from another by the inactive regions, the array of plurality of rows of linear arrays of regions being disposed on the substrate;
a plurality of control electrodes, each of plurality of control electrodes being disposed over a corresponding one of the plurality of rows of linear arrays of regions;
wherein:
each one of the plurality of active regions in a first one of the plurality of rows of linear arrays of regions being disposed between:
a first pair of inactive regions in said first one of the plurality of rows of linear arrays of regions;
a second pair of inactive regions;
wherein one of the inactive regions in the second pair of inactive regions being in a second one of the plurality of rows of linear arrays of regions and one of the inactive regions in the second pair of inactive regions being in a third one of the plurality of rows of linear arrays of regions; and
wherein the first one of the plurality of rows of linear arrays of regions is disposed between: the second one of the plurality of rows of linear arrays of regions; and the third one of the plurality of rows of linear arrays of regions; and
wherein each one of the inactive regions has a higher resistivity than each one of the active regions.

16. A Field Effect Transistor (FET), comprising:
a substrate;
a plurality of active regions arranged in rows and columns disposed on the substrate, the active regions in each one of the rows being separated one from another by an inactive region and the active regions in each one of the columns being separated one from another by the inactive region; and
a plurality of gate electrodes arranged in rows, each one of the rows of gate electrodes being disposed over a corresponding one of the rows of active regions; and
wherein the plurality of gate electrodes are connected to a common gate contact.

17. A Field Effect Transistor (FET), comprising:
a substrate;
a plurality of rows and columns of active regions disposed on the substrate, the active regions in each one of the rows and columns being separated by an inactive region;
a plurality of rows of finger-like control electrodes, each one of the control electrodes being disposed over the active regions in a corresponding one of the rows; the plurality of active regions being staggered on alternating opposite sides of a lines between a pair of the columns of active regions; and wherein rows of gate electrodes are connected to a common gate contact.

18. A Field Effect Transistor (FET), comprising:
a substrate;
an array of plurality of rows of linear arrays of regions, one of the regions being an active region and another one of the regions being an inactive region, the active regions being separated one from another by the inactive regions, the array of plurality of rows of linear arrays of regions being disposed on the substrate;
a plurality of control electrodes, each of plurality of control electrodes being disposed over a corresponding one of the plurality of rows of linear arrays of regions;
wherein:
each one of the plurality of active regions in a first one of the plurality of rows of linear arrays of regions being disposed between:
a first pair of inactive regions in said first one of the plurality of rows of linear arrays of regions;
a second pair of inactive regions;
wherein one of the inactive regions in the second pair of inactive regions being in a second one of the plurality of rows of linear arrays of regions and one of the inactive regions in the second pair of inactive regions being in a third one of the plurality of rows of linear arrays of regions; and
wherein the first one of the plurality of rows of linear arrays of regions is disposed between: the second one of the plurality of rows of linear arrays of regions; and the third one of the plurality of rows of linear arrays of regions wherein the plurality of control electrodes are connected to a common gate contact.

19. A Field Effect Transistor (FET), comprising:
a substrate;
a plurality of active regions and a plurality of in active regions arranged in rows and columns disposed on the substrate, the active regions in each one of the rows being separated one from another by a corresponding one of the plurality of inactive regions in such one of the rows, the active regions in each one of the columns being separated one from another by a corresponding one of the inactive region in such one of the columns; and a plurality of gate electrodes arranged in rows, each one of the gate electrodes in each one of the rows being disposed over the plurality of active regions and plurality of inactive regions in a corresponding one of the rows of active regions and the inactive regions.

20. A Field Effect Transistor (FET), comprising:

a substrate;

a plurality of rows of active regions and a plurality of columns of active regions disposed on the substrate, the active regions in each one of the rows and columns being separated by one of the plurality of an inactive region in such one of the rows and columns;

a plurality of rows of finger-like control electrodes, each one of the control electrodes being disposed over the active regions and the inactive regions in a corresponding one of the rows; the plurality of active regions being staggered on alternating opposite sides of a lines between a pair of the columns of active regions; and wherein each one of the laterally extending finger-like control electrodes controls a flow of carriers through each one of the plurality of active regions between a source electrode and a drain electrode.

* * * * *